US011454649B2

(12) United States Patent
Pak

(10) Patent No.: US 11,454,649 B2
(45) Date of Patent: Sep. 27, 2022

(54) INTEGRATED POGO PIN ENABLING INTEGRATED HOUSING

(71) Applicant: Sangyang Pak, Cheongju-si (KR)

(72) Inventor: Sangyang Pak, Cheongju-si (KR)

( * ) Notice: Subject to any disclaimer, the term of this patent is extended or adjusted under 35 U.S.C. 154(b) by 10 days.

(21) Appl. No.: 16/972,451

(22) PCT Filed: Jun. 7, 2019

(86) PCT No.: PCT/KR2019/006866
§ 371 (c)(1),
(2) Date: Dec. 29, 2020

(87) PCT Pub. No.: WO2019/235874
PCT Pub. Date: Dec. 12, 2019

(65) Prior Publication Data
US 2021/0231706 A1 Jul. 29, 2021

(30) Foreign Application Priority Data
Jun. 7, 2018 (KR) ........................ 10-2018-0065292

(51) Int. Cl.
*G01R 1/067* (2006.01)
*H01R 13/24* (2006.01)

(52) U.S. Cl.
CPC ..... *G01R 1/06722* (2013.01); *G01R 1/06738* (2013.01); *H01R 13/2421* (2013.01)

(58) Field of Classification Search
CPC ............ G01R 1/06722; G01R 1/06738; H01R 13/2421
See application file for complete search history.

(56) References Cited

U.S. PATENT DOCUMENTS 9,435,827 B2 9/2016 Pak
2018/0013217 A1* 1/2018 Kuroda .................. H01R 12/58

FOREIGN PATENT DOCUMENTS

| | | | | |
|---|---|---|---|---|
| JP | 2011012992 | A * | 1/2011 | |
| KR | 10-2010-0105360 | A | 9/2010 | |
| KR | 10-2012-0031493 | A | 4/2012 | |
| KR | 10-2012-0032500 | A | 4/2012 | |
| KR | 10-2014-0026736 | A | 3/2014 | |
| KR | 10-2016-0085457 | A | 7/2016 | |
| KR | 20160085457 | A * | 7/2016 | ......... G01R 1/06722 |

* cited by examiner

*Primary Examiner* — Paresh Patel
(74) *Attorney, Agent, or Firm* — Rabin & Berdo, P.C.

(57) ABSTRACT

Proposed is an integrated pogo pin including: a casing portion rolled up to have a C-shaped cross section; an upper elastic portion extending from a first side surface of the casing portion in a first spiral direction toward an upper-end opening along an inner circumferential surface thereof; an upper probe portion arranged on a non-stationary end of the upper elastic portion and rolled up to a shape of a cylinder in such a manner as to reciprocate upward and downward within the upper-end opening; a lower elastic portion extending from the first side surface of the casing portion in a second spiral direction toward a lower-end opening along the inner circumferential surface; and a lower probe portion arranged on a non-stationary end of the lower elastic portion and rolled up to the shape of the cylinder in such a manner as to reciprocate upward and downward within the lower-end opening.

12 Claims, 6 Drawing Sheets

INTEGRATED POGO PIN ENABLING INTEGRATED HOUSING

TECHNICAL FIELD

The present disclosure relates to an integrated pogo pin for which an integrated housing is possible.

BACKGROUND ART

Generally, a pogo pin is a component that is widely used not only in an apparatus for testing a semiconductor wafer, an LCD module, an image sensor, a semiconductor package, and the like, but also in various sockets, a connection unit for a battery in a mobile phone, and the like.

FIG. 1 is a cross-sectional view schematically illustrating a pogo pin 6 in the related art. The pogo pin 6 includes an upper probe tip 12, a lower probe tip 13, a coil spring 14, and a pin body 11. The upper probe tip 12 is a metal body that is brought into contact with an external terminal of an element (for example, a semiconductor package) subject to testing. The lower probe tip 13 is a metal body that is brought into contact with a contact pad of a test board. The coil spring 14 is arranged between the upper probe tip 12 and the lower probe tip 13 and makes it possible to make elastic contact with each of the upper and lower probe tips 12 and 13. The pin body 11 accommodates a lower end of the upper probe tip 12, an upper end of the lower probe tip 13, and the coil spring 14.

FIG. 2 is a cross-sectional view schematically illustrating a socket 30 for testing the semiconductor package, which accommodates a plurality of pogo pins 6 that makes it possible to make electrical connection between an external terminal 3*a* of an element 3 subject to testing and a contact pad 5*a* (for example, a metal wiring line) of a test board 5. As illustrated, with the socket 30 for testing the semiconductor package, the plurality of pogo pins 5 are arranged a predetermined distance apart within an insulating body 1 in order to protect the plurality of pogo pins 5 against deformation and external physical impact.

When performing testing, the upper probe tip 12 is brought into the external terminal 3*a* of the element 2 subject to testing, and the lower probe tip 13 is brought into contact with the contact pad 5*a* of the test board 5. The upper probe tip 12 and the lower probe tip 13 are elastically supported on the coil spring 14 within the pogo pin 6, and thus the semiconductor package 3 and the test board 5 are electrically connected to each other, thereby precisely testing the semiconductor package.

With a gradual increase in miniaturization, integration, and high performance of the semiconductor package, there is an increasing need to reduce the size of the pogo pin 6 for testing the semiconductor package. Specifically, the shorter a distance between each of the external terminals 3*a* of the semiconductor package 3, the smaller a diameter of the pogo pin 6 needs to be. In order to minimize electrical resistance between the semiconductor package and the test board 5, there is a need not only to minimize a length of the pogo pin 6, but also to decrease a thickness of the insulating body 1 supporting the pogo pin 6.

The pogo pin 6 with a compact structure has a problem of maintaining a state of electrical contact among the upper probe tip 12, an external cylindrical body 12, and the lower probe tip 13 and a state of connection between the pogo pin 6 and the insulating body 1.

DISCLOSURE

Technical Problem

An objective of the present disclosure, which was conceived to solve the above-mentioned problem, is to provide a pogo pin configured to possibly minimize an external diameter and a length thereof in such a manner as to find application in large-scale integration and/or high performance.

Another objective of the present disclosure is to provide a pogo pin with an integrated structure, which is capable of providing the shortest signal path between an upper probe tip and a lower probe tip, minimizing a loss of an electrical signal, and thus improving signal quality.

Still another of the present disclosure is to provide a pogo pin with a simple integrated structure, which is capable of being easily manufactured and improving the durability thereof.

Technical Solution

In order to achieve the above-mentioned objectives, according to an aspect of the present disclosure, there is provided an integrated pogo pin including: a casing portion rolled up to have a C-shaped cross section; an upper elastic portion extending to a length from a first side surface of the casing portion in a first spiral direction toward an upper-end opening along an inner circumferential surface thereof; an upper probe portion arranged on a non-stationary end of the upper elastic portion and rolled up to a shape of a cylinder in such a manner as to possibly reciprocate upward and downward within the upper-end opening in the casing portion; a lower elastic portion extending to a length from the first side surface of the casing portion in a second spiral direction toward a lower-end opening along the inner circumferential surface thereof; and a lower probe portion arranged on a non-stationary end of the lower elastic portion and rolled up to the shape of the cylinder in such a manner as to possibly reciprocate upward and downward within the lower-end opening in the casing portion, wherein the inner circumferential surface of the casing portion having the C-shaped cross section is positioned a distance away from an outer circumferential surface of the upper probe portion.

In the integrated pogo pin, the upper elastic portion may be formed as a lengthwise extending body with a first thickness, and the lower elastic portion may be formed as a lengthwise extending body with a second thickness. In the integrated pogo pin, the second thickness may be smaller than the first thickness.

In the integrated pogo pin, a first width of the casing portion may be selectively the same as or greater than a second width of the upper probe portion.

The integrated pogo pin may further include one or more protrusions, protruding toward the outside thereof, on an external surface of the casing portion.

In the integrated pogo pin, an intersection point of a stationary end of the upper elastic portion and a stationary end of the lower elastic portion may be a point, positioned at a height smaller than half a height of the casing portion, on a first side surface thereof.

In the integrated pogo pin, a lower side surface of the upper probe portion may be positioned below an upper side surface of the casing portion, and the upper probe portion reciprocating upward and downward may be configured in such a manner as to deviate from or be separated from an internal space in the casing portion.

In the integrated pogo pin, correspondingly, an upper side surface of the lower probe portion may be positioned above a lower side surface of the casing portion, and the lower probe portion reciprocating upward and downward may be configured in such a manner as to deviate from or be separated from the internal space in the casing portion.

The integrated pogo pin may be a single component that results from integrally connecting the casing portion, the upper elastic portion, the upper probe portion, the lower elastic portion, and the lower probe portion to each other.

Features and advantages of the present disclosure will become further apparent from the following detailed description that is provided with reference to the accompanying drawings.

Instead of being interpreted as having an ordinary meaning defined in a dictionary, terms and words used in the present specification and claims should be interpreted as having meanings and concepts that are consistent with the technical idea of the present disclosure, on the principle that an inventor can define terms and concepts to describe his/her invention with reasonable clarity, deliberateness, and precision.

Advantageous Effects

As described above, according to the present disclosure, an integrated pogo pin capable of shortening a signal path and improving signal quality can be provided.

Particularly, according to the present disclosure, there is no need to include a spring-surrounding cylindrical pin body that has been used in the related art. Thus, an external diameter of the integrated pogo pin can be minimized. Accordingly, a plurality of the integrated pogo pins can be arranged in a predetermined pattern in a more compact manner on a large-scale integrated electronic component or the like.

According to the present disclosure, the upper probe portion, the lower probe portion, and the casing portion can be formed as a single component, thereby simplifying and streamlining a manufacturing process. Accordingly, the possible mass production of the integrated pogo pins can bring down the manufacturing cost.

Furthermore, according to the present disclosure, the casing portion is rolled up to have the C-shaped cross section, in such a manner that the external diameter of the integrated pogo pin can vary with an external force. Thus, it is possible that the integrated pogo pin is easily inserted into and removed from a pin hole in an insulating housing.

Moreover, according to the present disclosure, it is possible that an integrated housing, that is, a housing having a single body, accommodates and handles a plurality of the pogo pins that are arranged.

BEST MODE

Figure 1:
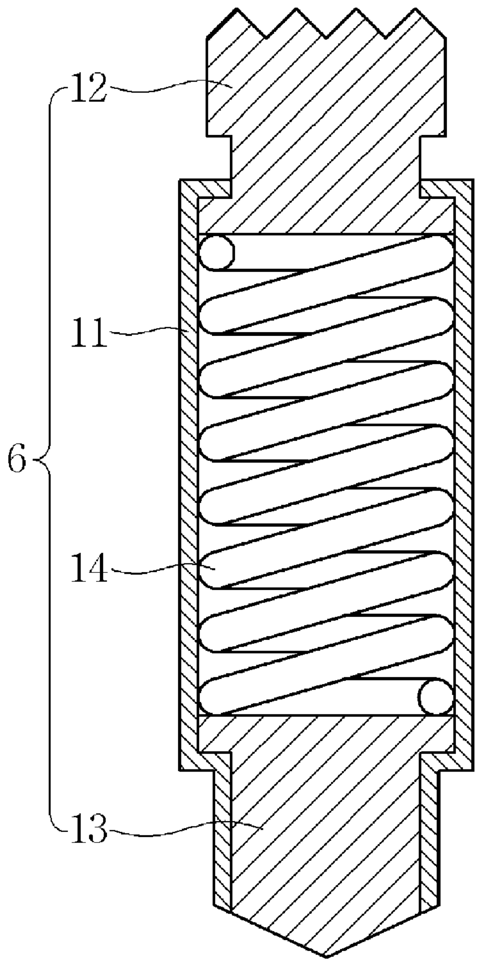
FIG. 1 is a cross-sectional view schematically illustrating a pogo pin according to the related art.
Figure 2:
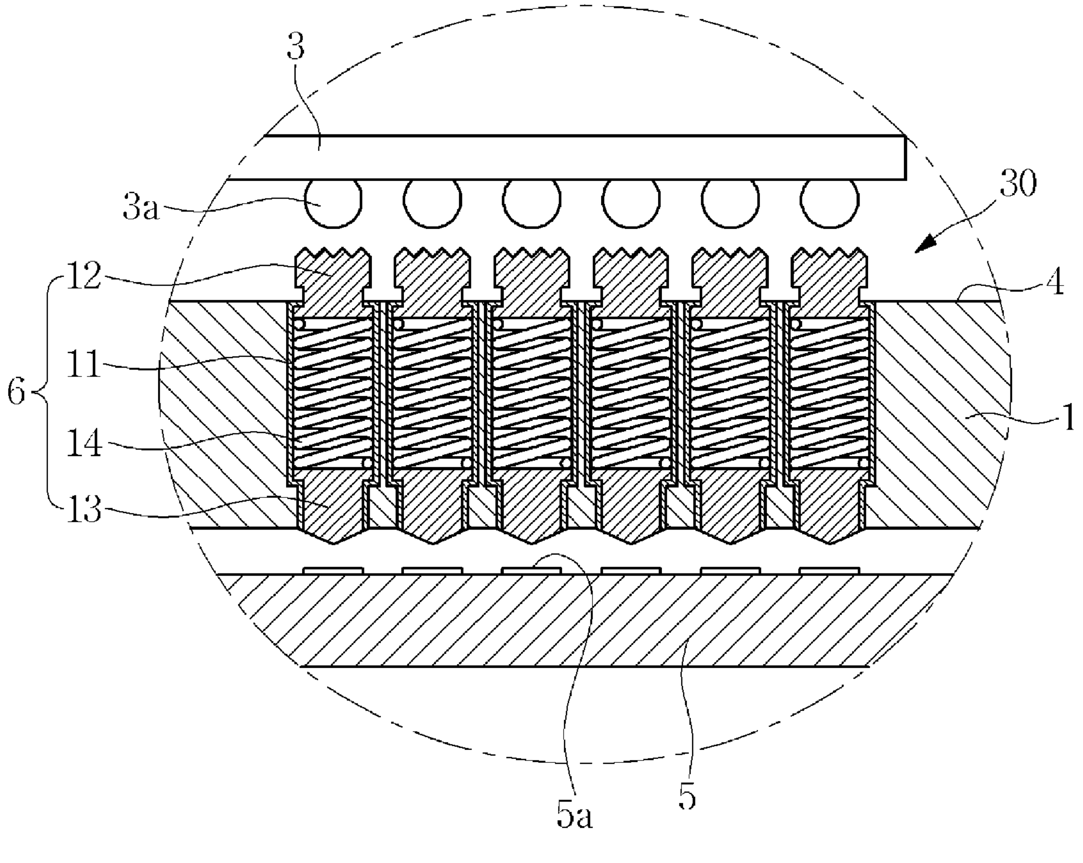
FIG. 2 is a cross-sectional view schematically illustrating a socket for testing a semiconductor package, in which the pogo pin illustrated in FIG. 1 is arranged.

Objectives, specific advantages, and novel features of the present disclosure will become further apparent from embodiments that will be described in detail below with reference to the accompanying drawings. It should be noted that the same constituent elements, although illustrated in different drawings, are given the same reference character, if possible, throughout the present specification. In addition, in the following description of the present disclosure, in a case where it is determined that detailed descriptions of functions and configurations known in the art to which the present disclosure pertains will unnecessarily make the nature and gist of the present disclosure unclear, detailed descriptions thereof are omitted. The terms first, second, and so on are used throughout the present specification in order to distinguish one constituent element to another and do not impose any limitation on meanings of the constituent elements. Some constituent elements are illustrated in an exaggerated or schematic manner in the accompanying drawings or other constituent elements are omitted therefrom. The constituent elements illustrated therein have not necessarily been drawn to scale.

An embodiment of the present disclosure will be described in detail below with reference to the accompanying drawings.

Figure 3B:
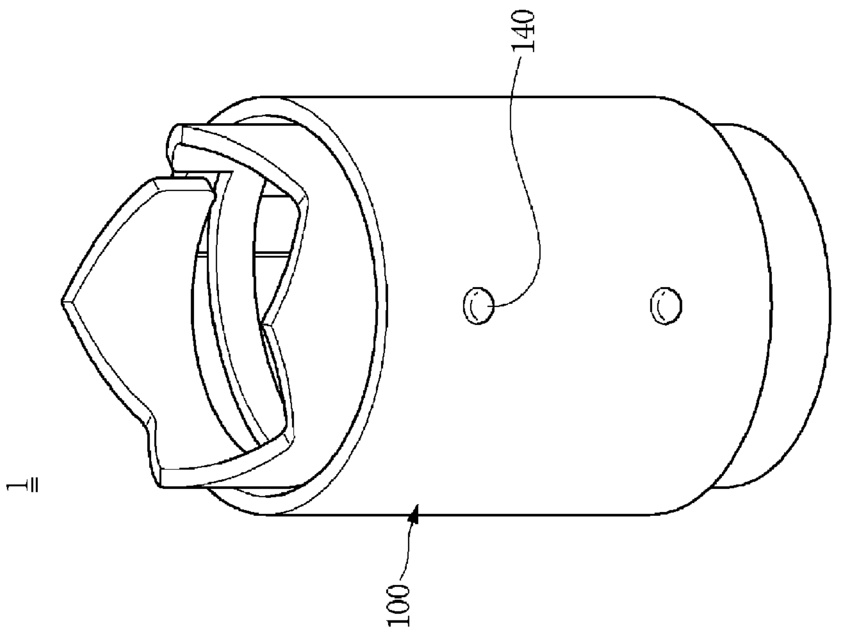
FIG. 3(*a*) is a perspective view illustrating an integrated pogo pin according to a preferred embodiment of the present disclosure, when viewed from a first direction, and FIG. 3(*b*) is a perspective view illustrating the integrated pogo pin according to the preferred embodiment of the present disclosure, when viewed from a second direction.
Figure 3A:
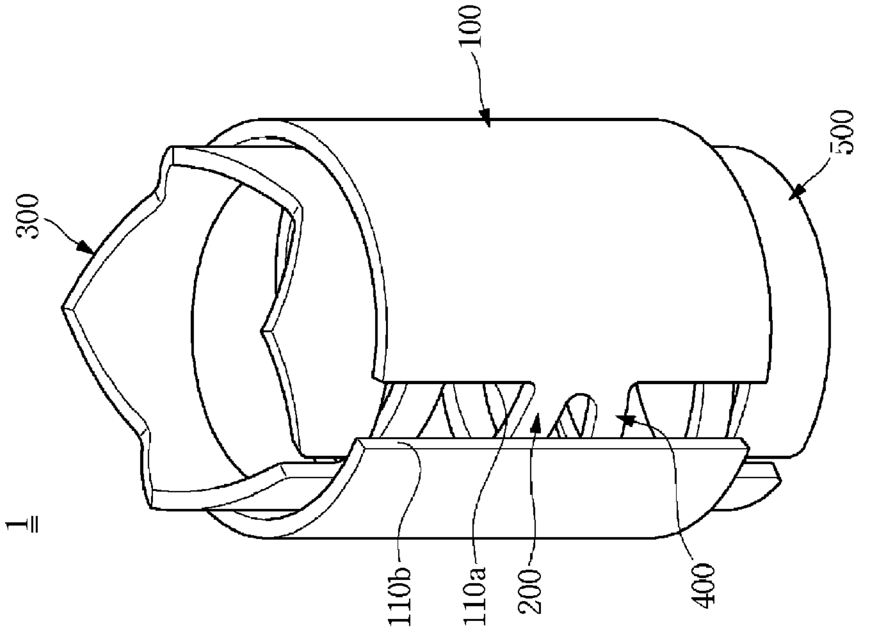
Figure 4:
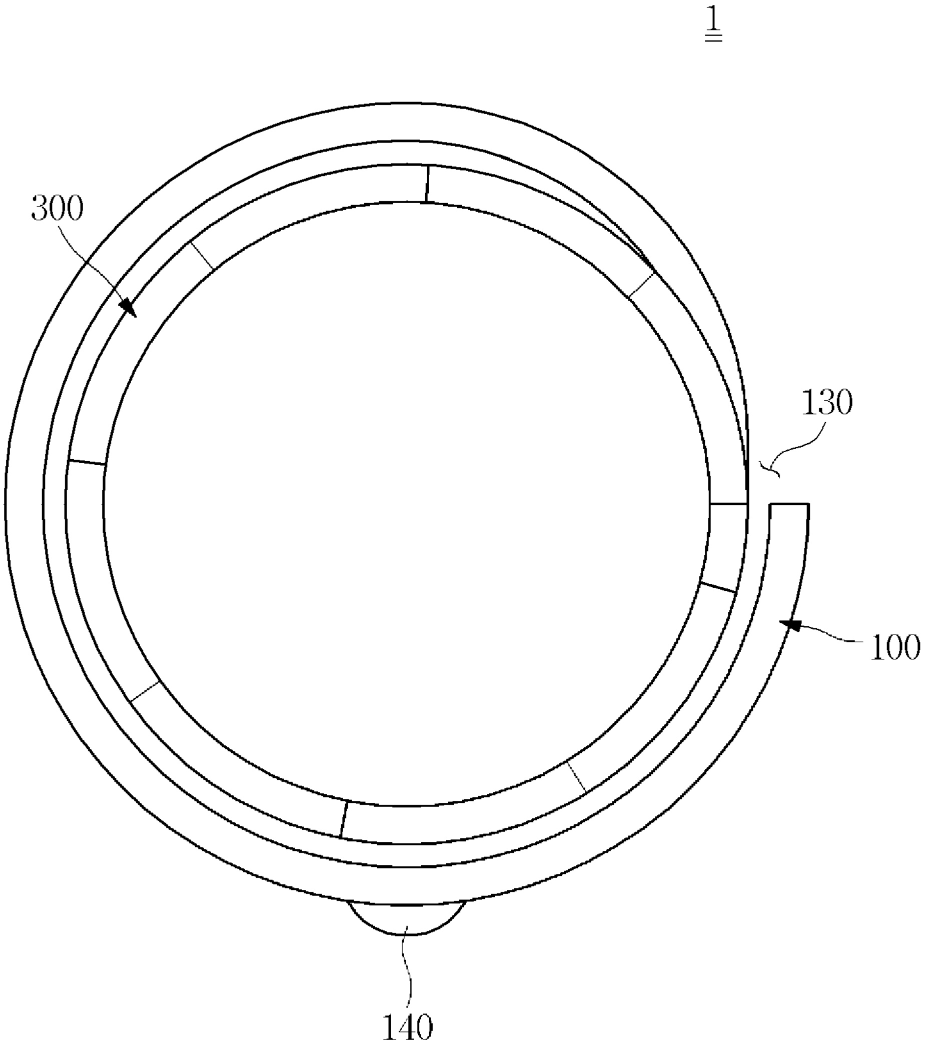
FIG. 4 is a top plan view schematically illustrating the integrated pogo pin according to the preferred embodiment of the present disclosure.
Figure 5:
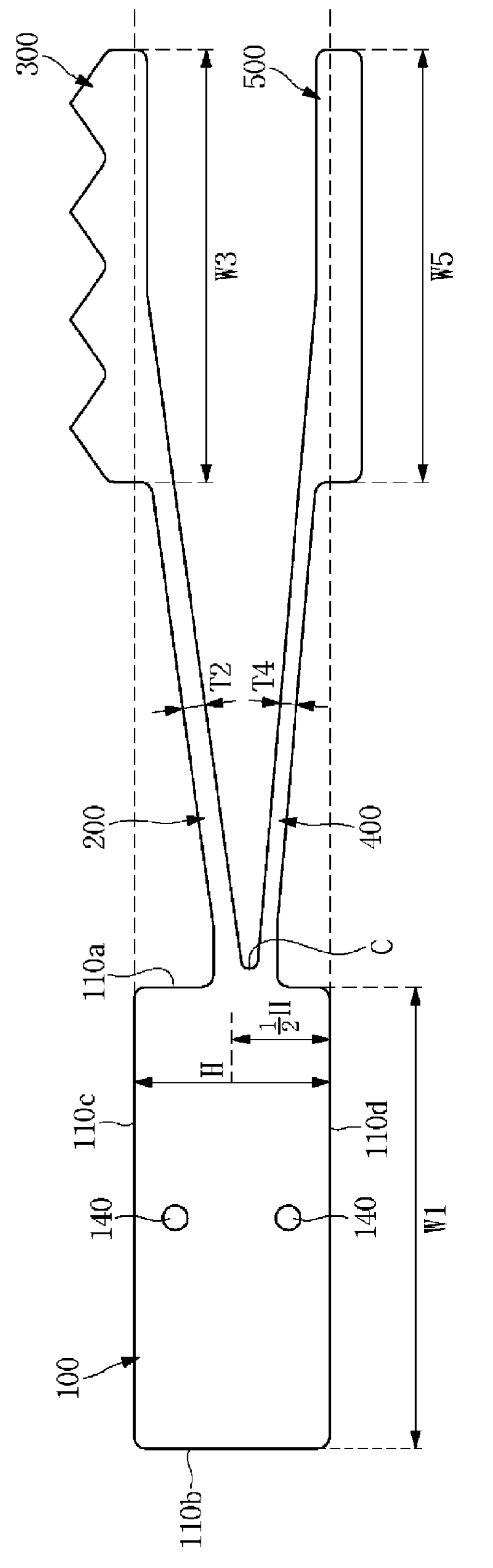
FIG. 5 is a development view schematically illustrating the integrated pogo pin according to the preferred embodiment of the present disclosure.

With reference to FIGS. 3 to 5, an integrated pogo pin 1 according to a preferred embodiment of the present disclosure, for example, is a contact for an electrical device, which electrically connects a pattern of an external terminal (or a lead) of a semiconductor package and a pattern of a printed circuit board (hereinafter referred to as a PCB) to each other on a one-to-one basis. The integrated pogo pin 1 is configured in such a manner that an upper probe portion 300 and a lower probe portion 500 protrude outward from near an upper surface and a lower surface, respectively, of a housing arranged between the semiconductor package and the PCB. With this configuration, the upper probe portion 300 and the lower probe portion 500, when brought into contact with the pattern of the external terminal of the semiconductor package and the pattern of PCB, respectively, are elastically transformed due to contact forces exerted thereto, thereby ensuring reliable electrical connection. Thus, an electrical signal is stably transferred without distortion.

The integrated pogo pin 1 according to the preferred embodiment of the present disclosure includes a casing portion 100, an upper elastic portion 200, the upper probe portion 300, a lower elastic portion 400, and the lower probe portion 500. The casing portion 100 is rolled up to have a C-shaped cross section. The upper elastic portion 200 extends to a length from a first side surface of the casing portion 100 having the C-shaped hollow cross section, in a first spiral direction toward an upper-end opening along an inner circumferential surface thereof. The upper probe portion 300 is arranged on an end of the upper elastic portion 200. The lower elastic portion 400 extends to a length from the first side surface of the casing portion 100 having the C-shaped hollow cross section, in a second spiral direction toward a lower-end opening along the inner circumferential surface thereof. The lower probe portion 500 is arranged on an end of the lower elastic portion 400. The upper probe portion 300 is arranged in such a manner that the upper probe portion 300 is elastically supported on the upper elastic portion 200 wound up in a spiral direction along the inner circumferential surface of the rolled-up casing portion 100 and thus is arranged to possibly reciprocate upward and downward within the upper-end opening to be formed with an upper side surface of the casing portion 100. The lower probe portion 500 is correspondingly arranged in such a manner that the lower probe portion 500 is elastically supported on the lower elastic portion 400 wound up in a spiral direction opposite to the winding-up spiral direction of the upper elastic portion 200 along the inner circumferential surface of the casing portion 100 and thus is arranged to possibly reciprocate upward and downward within the lower-end opening to be formed with a lower side surface of the casing portion 100.

Preferably, the integrated pogo pin 1 according to the present disclosure includes the casing portion 100, the upper elastic portion 200, the upper probe portion 300, the lower elastic portion 400, and the lower probe portion 500, which are formed as a single component.

The casing portion 100, as illustrated, is a rectangular plate-shaped member having a first side surface 110*a*, a second side surface 110*b*, an upper side surface 110*c*, and a lower side surface 110*d*. The second side surface 110*b* runs in parallel with the first side surface 110*a*. The upper side surface 110*c* runs to a length from an upper end of the first side surface 110*a* to an upper end of the second side surface 110*b*. The lower side surface 110*d* runs to a length from a lower end of the first side surface 110*a* to a lower end of the second side surface 110*b*. For example, through a forming operation, such as bending or rolling, the casing portion 100 is rolled up to approximately the shape of an empty cylinder. Preferably, according to the present disclosure, a side-surface opening 130 is formed between the first side surface 110*a* and the second side surface 110*b* of the casing portion 100 rolled up to have the C-shaped cross section. The side-surface opening 130, as illustrated, is interposed between the first side surface 110*a* and the second side surface 110*b* of the casing portion 100 rolled up to have the C-shaped cross section, and thus an external diameter of the casing portion 100 can be varied by adjusting a width of the side-surface opening 130, shown in FIG. 4.

For example, the integrated pogo pin 1 according to the present disclosure is cut out from a metal plate with high electrical conductivity through a punching operation, as illustrated in FIG. 5, and then the cut-out integrated pogo pin 1 is rolled up as illustrated in FIG. 3. One or more protrusions 140 are formed on an external surface of the cut-out casing portion 100. It is widely known to a person of ordinary skill in the art that, through a press operation or the like, the protrusion 140 is formed to protrude toward the outside from the cut-out casing portion 100.

Furthermore, the casing portion 100 has a first width W1. The first width W1 is a distance from the first side surface 110*a* to the second side surface 110*b*.

The upper elastic portion 200, as described above, is shaped like a cylinder (preferably, shaped to have the C-shaped cross section) through the forming operation, such as bending or rolling, and is transformed to the shape of a coil spring, thereby independently retaining an elastic force. Specifically, the upper elastic portion 200, as illustrated in FIG. 5, extends over a long distance toward the outside, in a manner that is inclined upward at a predetermined angle, from the first side surface 110*a* of the casing portion 100.

A stationary end of the upper elastic portion 200 is arranged on the first side surface 110*a* of the casing portion 100. The upper probe portion 300 is arranged on a non-stationary end of the upper elastic portion 200. The upper elastic portion 200, as illustrated, is interposed between the casing portion 100 and the upper probe portion 300. Thus, an elastic restoring force is provided, for example, in such a manner that the upper probe portion 300 is strongly brought into contact with the external terminal of the semiconductor package. In a case where an external force is exerted on the upper probe portion 300, the upper elastic portion 200 is compressed, and thus the upper probe portion 300 moves into the casing portion 100 having the C-shaped cross section. When the external force is canceled, with the elastic restoring force of the upper elastic portion 200, the upper probe portion 300 returns to an original position thereof.

The upper probe portion 300, as described above, is arranged on the non-stationary end of the upper elastic portion 200 in a direction that is the same as that of the casing portion 100. With the upper elastic portion 200, the upper probe portion 300 reciprocates upward and downward within the upper-end opening in the casing portion 100. The upper probe portion 300 is formed to have the shape capable of ensuring smooth electrical contact with the external terminal of the semiconductor package. That is, an upper end of the upper probe portion 300 is formed to have a sawtooth shape in a development view, and thus the upper probe portion 300 has a crown-shaped tip.

As illustrated, a lower side surface of the upper probe portion 300 is positioned below the upper side surface 110*c* of the casing portion 100. As a result, the upper probe portion 300 having the crown-shaped tip, which is rolled up to be hollow therein, is configured to reliably move into the casing portion 100 having the C-shaped hollow cross section in the case where the external force is exerted on the upper probe portion 300. Furthermore, the upper probe portion 300 is configured not to completely move out of the casing portion 100 having the C-shaped cross section in a case where the external force is canceled. Furthermore, this arrangement makes it possible to employ a structure in which an upper end of the upper probe portion 300 protrudes through the upper-end opening in the casing portion 100 to the outside.

The lower elastic portion 400 is shaped like a cylinder (preferably, shaped to have the C-shaped cross section), for example, through the forming operation, such as bending or rolling, and is transformed to the shape of a coil spring, thereby independently retaining the elastic force. Specifically, the lower elastic portion 400, as illustrated in FIG. 5, extends over a long distance toward the outside, in a manner that is inclined downward at a predetermined angle, from the first side surface 110*a* of the casing portion 100. The lower elastic portion 400 and the upper elastic portion 200 are arranged, approximately in the V-shaped form, on the first side surface 110*a* of the casing portion 100.

A stationary end of the lower elastic portion 400 is arranged on the first side surface 110*a* of the casing portion 100. The lower probe portion 500 is arranged on a non-stationary end of the lower elastic portion 400. The lower elastic portion 400, as illustrated, is interposed between the casing portion 100 and the lower probe portion 500. Thus, the elastic restoring force is provided, for example, in such a manner as to ensure a state of reliable contact of the lower probe portion 500 with the conductive pattern of the PCB. In a case where the external force is exerted on the lower probe portion 500, the lower elastic portion 400 is compressed, and thus the lower probe portion 500 moves into the casing portion 100 having the C-shaped cross section. When the external force is canceled, with the elastic restoring force of the lower elastic portion 400, the lower probe portion 500 returns to an original position thereof.

Furthermore, the lower elastic portion 400 is formed as a lengthwise extending body with a second thickness T4. In contrast, the upper elastic portion 200 is formed as a lengthwise extending body with a first thickness T2. According to the present disclosure, the second thickness of the lower elastic portion 400 is smaller than the first thickness of the upper elastic portion 200. For this reason, in a case where the external force is exerted in an upward-downward direction, the lower elastic portion 400 is compressed earlier than the upper elastic portion 200. An upper side surface and a lower side surface of the lower elastic portion 400 rolled up in the second spiral direction are brought into contact with each other, thereby providing a short signal path.

The lower probe portion 500, as described above, is arranged on the non-stationary end of the lower elastic portion 400 in the direction that is the same as the direction of the casing portion 100. With the lower elastic portion 400, it is possible that the lower probe portion 500 reciprocates upward and downward within the lower-end opening in the casing portion 100. The lower probe portion 500 is formed to have a flat lower end thereof, for example, in such a manner as to ensure the smooth electrical contact with the pattern of the PCB and to prevent damage to the pattern of the PCB when brought into contact therewith. The lower probe portion 500 is not limited to the flat lower end thereof and may have a crown-shaped lower end thereof.

As illustrated, an upper side surface of the lower probe portion 500 is positioned above the lower side surface 110*d* of the casing portion 100. As a result, the lower probe portion 500 rolled up to the shape of a cylinder is configured to reliably move into the casing portion 100 having the C-shaped hollow cross section in a case where the external force is exerted to the lower probe portion 500. Furthermore, the lower probe portion 500 is configured not to completely moved out of the casing portion 100 having the C-shaped cross section in the case where the external force is canceled. Furthermore, this arrangement makes it possible to employ a structure in which a lower end of the lower probe portion 500 protrudes through the lower-end opening in the casing portion 100 to the outside.

As described above, according to the present disclosure, heights (positions) at which the upper probe portion 300 and the lower probe portion 500 are arranged are limited in such a manner that the upper probe portion 300 and the lower probe portion 500 reciprocate within the upper-end opening and the lower-end opening, respectively, in the casing portion 100 rolled up to have the C-shaped cross section. Furthermore, a second width W3 of the upper probe portion 300 and a third width W5 of the lower probe portion 500 are the same as, or smaller than the first width W1 of the casing portion 100. That is, according to the present disclosure, there is provided a spaced distance between the inner circumferential surface of the casing portion 100 having the C-shaped cross section and an outer circumferential surface of the upper probe portion 300 rolled up to the shape of a cylinder (refer to FIG. 4). According to the present disclosure, correspondingly, a spaced distance may be maintained between the inner circumferential surface of the casing portion 100 having the C-shaped cross section and an outer circumferential surface of the lower probe portion 500 rolled up to the shape of a cylinder. The spaced distance makes it possible to reserve room for the upper probe portion 300 rolled up to the shape of a cylinder and/or the lower probe portion 500 rolled up to the shape of a cylinder to reciprocate within an internal space in the casing portion 100. Furthermore, the spaced distance makes it possible to ensure a reduction in the external diameter of the casing portion 100 when the integrated pogo pin 1 is inserted into a pin hole in the housing as illustrated in FIG. 6.

In the integrated pogo pin 1 according to the present disclosure, as illustrated in FIG. 5, an intersection point C is positioned at a height smaller than half a height (H) of the casing portion 100. The stationary end of the upper elastic portion 200 and the stationary end of the lower elastic portion 400, which are arranged in the V-shaped form on the first side surface 110*a* of the casing portion 100 intersect at the intersection point C. A spaced distance between the upper side surface and the lower side surface of the lower elastic portion 400 rolled up in the spiral direction can be narrowed. Thus, although the lower elastic portion 400 is compressed with a small external force, the narrowing of the spaced distance helps the upper side surface and the lower side surface of the lower elastic portion 400, which have different heights in a rolled-up state, to be quickly brought into contact with each other.

Figure 6A:
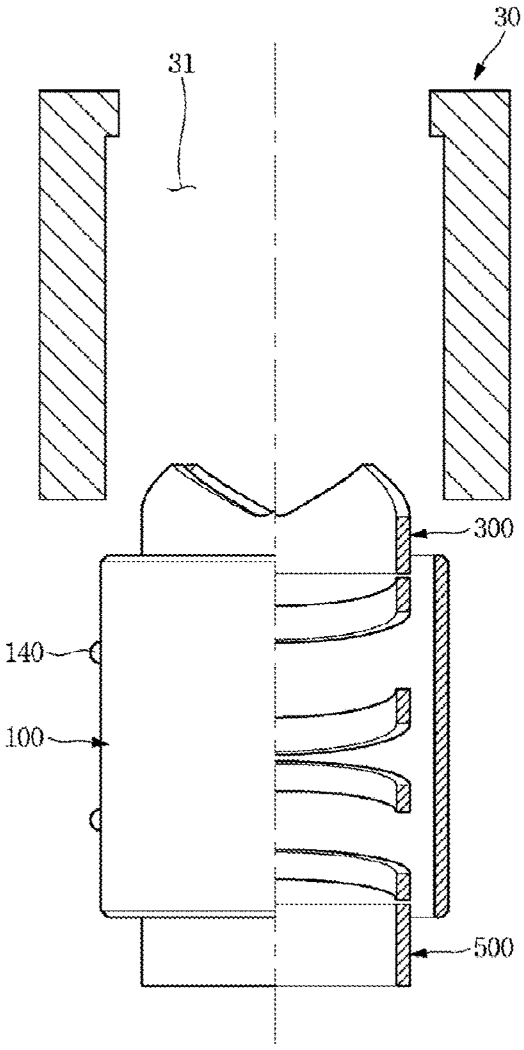
FIG. 6(*a*) is a cross-sectional view schematically illustrating a state where the integrated pogo pin according to the preferred embodiment of the present disclosure is not yet compressed, and FIG. 6(*b*) is a cross-sectional view schematically illustrating a state where the integrated pogo pin according to the preferred embodiment of the present disclosure is compressed.
Figure 6B:
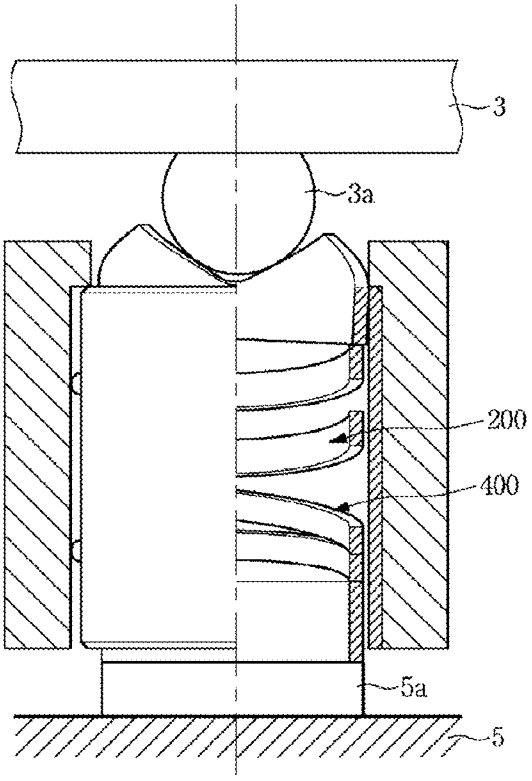

FIG. 6 is a view illustrating a state where the integrated pogo pin 1 according to the preferred embodiment of the present disclosure and a housing 30 are fastened to each other. In order to be protected against deformation and external physical impact, the integrated pogo pin 1 is individually inserted into a pin hole 31 that is punched in a thickness direction in the housing 30. Thus, the integrated pogo pins 1 that are arranged a predetermined distance apart are inserted into the pin holes 31, respectively. The housing 30, made of an insulating material, is formed into one piece.

FIG. 6(*a*) illustrates a state where, for connection, the integrated pogo pin 1 is not yet into the pin hole 31 in the housing 30 made of an insulating material. The casing portion 100, rolled up to have the C-shaped cross section, of the integrated pogo pin 1 according to the present disclosure is formed to have an external diameter greater than an internal diameter of the pin hole 31.

FIG. 6(*b*) illustrates a state where, for connection, the integrated pogo pin 1 according to the present disclosure is inserted into the pin hole 31 in the housing 30 in order to electrically connect a semiconductor package 3 and a PCB 5 to each other. A decrease in the external diameter of the casing portion 100 narrows the width of the side-surface opening 130 (refer to FIG. 4). Thus, the casing portion 100 of the integrated pogo pin 1 is easily inserted into the pin hole 31. One or more protrusions 140 formed on an external surface of the casing portion 100 are pressed against an inner circumferential surface of the pin hole 31 and thus help the integrated pogo pin 1 to be held firmly in place. Particularly, due to gravity, the integrated pogo pin 1 inserted into the pin hole 31 is prevented from being separated from the housing 30.

The casing portion 100 that has elasticity and thus is retractable is inserted into the pin hole 31 in the integrated housing 30 and is held firmly in place at a fixed position. An internal surface of the pin hole 31 and the external surface of the casing portion 100 are brought into surface contact with each other. Thus, if the protrusion 140 is not provided, there is a need to exert an excessive force when the integrated log pin 1 is inserted into or removed from the pin hole 31. For example, in a case where the external diameter of the casing portion 100 is at maximum tolerance, the internal diameter of the pin hole 31 is at minimum tolerance, or in a case where these two situations occur at the same time, the problem of exerting an excessive force becomes serious.

In contrast, the formation of the protrusion 140 makes it possible for the protrusion 140 to bring the casing portion 100 into point contact with the pin hole 31. Thus, the advantage of easily attaching and detaching the integrated pogo pin 1 is achieved.

The above-described fastening structure not only provides the advantage of maintaining a state where the integrated pogo pin 1 is reliably fastened even in integrated housing 30 with small thickness, which has an integrated body, but also makes the integrated pogo pins 1 arranged in a compact manner. Furthermore, with the above-described fastening structure, the application of a predetermined external force makes the integrated pogo pin 1 separated easily from the pin hole 31 in the housing 30. Thus, it is possible that the integrated pogo pin 1 is repaired and replaced.

As illustrated in FIG. 6(*b*), for example, the integrated pogo pin 1 is arranged between the semiconductor package 3 and the PCB 5. The upper probe portion 300 is brought into contact with an external terminal 3*a* of the semiconductor package 3, and the lower probe portion 500 is brought into contact with a pattern 5*a* of the PCB 5. The upper probe portion 300 is inclined while the upper probe portion 300 is pressed by the semiconductor package 3 and moves into the upper-end opening in the casing portion 100. Thus, the outer circumferential surface of the upper probe portion 300 is brought into contact with the inner circumferential surface of the casing portion 100. At this point, the pressing by the semiconductor package 3 brings the upper side surface and the lower side surface of the lower elastic portion 400 rolled up in the second spiral direction into close contact with each other. Therefore, according to the present disclosure, the shortest excellent signal path is provided between the upper probe portion 300 and the lower probe portion 500.

It would be widely known and obvious to a person of ordinary skill in the art to which the present disclosure pertains that the integrated pogo pin 1 according to the preferred embodiment of the present disclosure finds application in a socket for testing the semiconductor package, which electrically connects an element subject to testing and a test board to each other in such a manner that all input and output terminals of the semiconductor package (the element subject to testing) are tested as described in Background Art.

The embodiment of the present disclosure is described above for the purpose of describing the present disclosure in detail. However, the integrated pogo pin according to the present disclosure is not limited to the above-described embodiment. It would be apparent to a person of ordinary skill in the art to which the present disclosure pertains that modifications and alterations are possibly made to the present disclosure without departing from the technical idea of the present disclosure.

The invention claimed is:

1. An integrated pogo pin comprising:

a casing portion rolled up to have a C-shaped cross section;

an upper elastic portion extending to a length from a first side surface of the casing portion in a first spiral direction toward an upper-end opening along an inner circumferential surface thereof;

an upper probe portion arranged on a non-stationary end of the upper elastic portion and rolled up to a shape of a cylinder in such a manner as to possibly reciprocate upward and downward within the upper-end opening in the casing portion;

a lower elastic portion extending to a length from the first side surface of the casing portion in a second spiral direction toward a lower-end opening along the inner circumferential surface thereof; and a lower probe portion arranged on a non-stationary end of the lower elastic portion and rolled up to the shape of the cylinder in such a manner as to possibly reciprocate upward and downward within the lower-end opening in the casing portion, wherein the inner circumferential surface of the casing portion having the C-shaped cross section is positioned a distance away from an outer circumferential surface of the upper probe portion, the upper elastic portion is formed as a lengthwise extending body with a first thickness, and the lower elastic portion is formed as a lengthwise extending body with a second thickness, the second thickness is smaller than the first thickness, an upper surface and a lower surface of the lower elastic portion rolled up in the second spiral direction are brought into contact with each other, the casing portion further comprises one or more protrusions, protruding toward the outside thereof, on an external surface thereof, a side-surface opening is located between a first side surface and a second side surface of the casing portion rolled up to have the C-shaped cross-section, the pogo pin is inserted into a pin hole in a one-piece housing by narrowing a width of the side-surface opening, and the pogo pin is prevented from being separated from the housing due to gravity.

2. The integrated pogo pin of claim 1, wherein, in a development view, a first width of the casing portion is the same as, or greater than a second width of the upper probe portion.

3. The integrated pogo pin of claim 1, wherein an intersection point of a stationary end of the upper elastic portion and a stationary end of the lower elastic portion is a point, positioned at a height smaller than half a height of the casing portion, on a first side surface thereof.

4. The integrated pogo pin of claim 1, wherein a lower surface of the upper probe portion is positioned below an upper side surface of the casing portion.

5. The integrated pogo pin of claim 1, wherein an upper surface of the lower probe portion is positioned above a lower surface of the casing portion.

6. The integrated pogo pin of claim 1, wherein the casing portion, the upper elastic portion, the upper probe portion, the lower elastic portion and the lower probe portion are formed as a single component.

7. An integrated pogo pin comprising:

a casing portion rolled up to have a C-shaped cross section;

an upper elastic portion extending to a length from a first side surface of the casing portion in a first spiral direction toward an upper-end opening along an inner circumferential surface thereof;

an upper probe portion arranged on a non-stationary end of the upper elastic portion and rolled up to a shape of a cylinder in such a manner as to possibly reciprocate upward and downward within the upper-end opening in the casing portion;

a lower elastic portion extending to a length from the first side surface of the casing portion in a second spiral direction toward a lower-end opening along the inner circumferential surface thereof; and a lower probe portion arranged on a non-stationary end of the lower elastic portion and rolled up to the shape of the cylinder in such a manner as to possibly reciprocate upward and downward within the lower-end opening in the casing portion, wherein the inner circumferential surface of the casing portion having the C-shaped cross section is positioned a distance away from an outer circumferential surface of the upper probe portion, the upper elastic portion is formed as a lengthwise extending body with a first thickness, and the lower elastic portion is formed as a lengthwise extending body with a second thickness, the second thickness is smaller than the first thickness, and an upper surface and a lower surface of the lower elastic portion rolled up in the second spiral direction are brought into contact with each other.

8. The integrated pogo pin of claim 7, wherein, in a development view, a first width of the casing portion is the same as, or greater than a second width of the upper probe portion.

9. The integrated pogo pin of claim 7, wherein an intersection point of a stationary end of the upper elastic portion and a stationary end of the lower elastic portion is a point, positioned at a height smaller than half a height of the casing portion, on a first side surface thereof.

10. The integrated pogo pin of claim 7, wherein a lower surface of the upper probe portion is positioned below an upper surface of the casing portion.

11. The integrated pogo pin of claim 7, wherein an upper surface of the lower probe portion is positioned above a lower surface of the casing portion.

12. The integrated pogo pin of claim 7, wherein the casing portion, the upper elastic portion, the upper probe portion, the lower elastic portion, and the lower probe portion are formed as a single component.

* * * * *